United States Patent
Ramesh

(10) Patent No.: US 6,625,435 B1
(45) Date of Patent: Sep. 23, 2003

(54) FREQUENCY SYNTHESIS USING A PROGRAMMABLE OFFSET SYNTHESIZER

(75) Inventor: Rajaram Ramesh, Cary, NC (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/514,658

(22) Filed: Feb. 29, 2000

(51) Int. Cl.[7] ............... H04B 1/26; H04B 1/06
(52) U.S. Cl. .......... 455/313; 455/318; 455/323; 455/255; 455/260
(58) Field of Search ............... 455/255, 260, 455/313, 318, 323

(56) References Cited

U.S. PATENT DOCUMENTS

| | | | |
|---|---|---|---|
| 4,870,699 A | * 9/1989 | Garner et al. | ............ 455/76 |
| 4,994,762 A | 2/1991 | Tay | |
| 5,128,633 A | 7/1992 | Martin et al. | |
| 5,267,182 A | 11/1993 | Wilke | |
| 5,422,604 A | 6/1995 | Jokura | |
| 5,610,559 A | 3/1997 | Dent | |
| 5,922,956 A | 7/1999 | Rhodes | |
| 5,960,364 A | 9/1999 | Dent | |
| 6,028,868 A | 2/2000 | Yeung et al. | |

FOREIGN PATENT DOCUMENTS

DE          19904748 A1     8/1999
EP          0172425 A1      7/1985

* cited by examiner

*Primary Examiner*—Vivian Chin
*Assistant Examiner*—Eugene Yun
(74) *Attorney, Agent, or Firm*—Coats & Bennett, P.L.L.C.

(57) ABSTRACT

A frequency synthesizer provides first and second frequency output signals based on first and second control signals, respectively. The first control signal determines the frequency of the first output signal produced by a main frequency synthesizer. The second control signal determines the frequency of a variable offset frequency signal produced by a programmable offset frequency synthesizer. A mixer combines this variable offset frequency signal with the first output signal to produce the second output signal. As such, the second output signal has a programmable variable offset frequency relationship with first output signal. First and second control signals are independently controllable. A mobile terminal may advantageously use the frequency synthesizer to generate a receiver injection signal and a transmitter carrier generation signal having a variable frequency offset relationship. Such capability permits the mobile terminal to operate within a wireless communications system employing statistical voice multiplexing techniques wherein dynamic communication channel reassignments require the mobile terminal to independently adjust its receive and transmit frequencies.

22 Claims, 8 Drawing Sheets

FREQUENCY SYNTHESIS USING A PROGRAMMABLE OFFSET SYNTHESIZER

BACKGROUND OF THE INVENTION

The present invention relates to frequency synthesis and, in particular, to primary frequency synthesizer combined with a programmable offset frequency synthesizer.

The demand for wireless communication services has grown dramatically in recent years. A major problem facing the wireless communications industry is the limitation of available radio frequency spectrum for wireless communications. Originally, a 50 MHz portion of the radio frequency spectrum was allocated for the Advanced Mobile Phone System (AMPS). AMPS uses Frequency Division Multiple Access (FDMA) to create 30 kHz radio frequency channels within this 50 MHz spectrum. Each radio frequency channel supports a single call within a geographic cell. Since the available bandwidth limits the number of available channels, the number of users that can be simultaneously supported using FDMA is severely limited.

As demand for wireless communication services has continued to grow, new digital processing techniques have been devised to more efficiently use the available spectrum and to increase system capacity. In a digital communication system, the analog speech waveform is first digitized and then compressed prior to modulation to decrease the data transmission time. These digital processing techniques allow several voice users to be multiplexed over a single radio frequency channel, which increases the cellular system capacity without increasing the bandwidth.

One multiple access technique in common use today is called Time Division Multiple Access (TDMA). TDMA is a multiple access scheme that allows multiple users to share the same radio frequency (RF) channel. Each RF channel is divided into periodic "frames" with each frame subdivided into several equal duration time "slots." Each slot serves as a communication channel. A mobile terminal is assigned a slot in the frame during which the mobile terminal transmits and receives information in short bursts. Since there are several slots per frame, a plurality of mobile users can simultaneously use each radio frequency channel. Thus, each radio frequency channel can support multiple communication channels. An exemplary TDMA scheme is standardized by the Electronics Industries Association (EIA) and the Telecommunication Industry Association (TIA) as TIA/EIA-136, which is incorporated herein by reference.

In a typical TDMA system, separate frequencies are used for downlink communications (base station to mobile terminal) and uplink communications (mobile terminal to base station). For each downlink frequency, there is a corresponding uplink frequency. The downlink frequency and its corresponding uplink frequency are referred to herein as a frequency pair. In conventional TDMA systems, such as TIA/EIA-136 and the European Global System for Mobile Communications (GSM), spacing between all downlink and corresponding uplink frequencies is fixed. For example, uplink and downlink frequencies for a given communications channel pair are offset by 80 MHz in GSM-based systems.

When a call is established, the mobile terminal is assigned a slot on both uplink and downlink frequencies. Assigned uplink and downlink time slots represent a communication channel. The assigned slots are then "owned" by that mobile terminal until the call ends unless the mobile terminal is reassigned to a different channel (e.g., hand-off). During the call, the assigned time slots cannot be used by any other mobile terminals.

Even with TDMA and other multiple access schemes, the high growth in demand for wireless communications services will soon exceed the capacity of existing mobile communications systems. No one expects that the growing demand for cellular services can be met by allocating additional spectrum. Therefore, the current challenge is to meet the demand by increasing system capacity within the spectrum already allocated.

Recently, a technique called statistical voice multiplexing has been proposed to increase the capacity of a mobile communication system. Statistical voice multiplexing exploits the intermittent nature of human speech to improve spectral efficiency of a mobile communication system. When engaged in normal conversation, humans alternately assume speaking and listening roles. Even when speaking, human speech contains "talkspurts" interspersed with numerous pauses during which no information is conveyed. Next-generation communication systems could potentially employ statistical voice multiplexing techniques that enable communications systems to exploit the intermittent nature of human conversation. Using statistical voice multiplexing, uplink and downlink slots are reassigned during pauses in speech. For example, a particular mobile terminal user might be at a point in conversation where he or she is listening to the far-end caller. When the mobile terminal is not transmitting information on its assigned uplink channel, the base station may reassign this uplink channel to another mobile terminal that actually needs it. When the user of this particular mobile terminal begins speaking, the base station must quickly assign an available uplink channel to it.

Using statistical voice multiplexing, the mobile terminal may change uplink and downlink communication channels many times during a single call. Because the uplink and downlink time slots are assigned based on availability, there is no longer a fixed offset relationship between uplink and downlink frequencies. Instead, all uplink and downlink time slots on each of the defined uplink and downlink frequencies are treated as a common pool of communication channel resources that may be dynamically assigned and reassigned among all of the active mobile terminals based on the actual needs of each mobile terminal.

Statistical voice multiplexing techniques require that each mobile terminal be able to quickly change its downlink and uplink frequencies many times during the course of a single call. The base station may require the mobile terminal to change only its uplink frequency, its downlink frequency, or both, depending on overall system needs. Unlike prior systems where the uplink frequency was related to the downlink frequency by a defined fixed offset, these newer generation communication systems require the mobile terminal to generate uplink frequencies over a range of defined offsets from the downlink frequency. This requirement increases the complexity and cost of the frequency synthesizers used by mobile terminals to generate the operating frequencies associated with assigned uplink and downlink frequencies. Therefore, there is a need for improvements in frequency synthesizers that can generate uplink and downlink frequencies that do not have a fixed relationship to one another.

SUMMARY OF THE INVENTION

The present invention provides methods and apparatus for producing two frequencies having a variable offset frequency relationship. A frequency synthesizer provides a first output signal having a frequency determined by a first control signal and a second output signal having a frequency offset from the first output signal as determined by a second control signal. A main synthesizer responsive to the first control signal produces the first output signal. A programmable offset frequency synthesizer responsive to the second control signal produces a variable frequency offset signal. A mixer combines this offset signal with the first output signal to produce the second output signal. As such, the second output signal has an offset frequency relationship with the first output signal, controllable based on changing the second control signal. Likewise, changing the first control signal results in a corresponding change of frequency in the first output signal. Thus, the absolute frequency value of the first and second output signals depends on the first control signal, while the offset frequency relationship between the first and second output signals depends on the second control signal.

In an exemplary embodiment, a mobile terminal incorporates the frequency synthesizer of the present invention. A logic unit within the mobile terminal sets the first control signal to a value corresponding to a downlink (receive) communications channel assignment and sets the second control signal corresponding to an uplink (transmit) communications channel assignment. A receiver within the mobile terminal uses the first output signal to downconvert the received signal for subsequent processing. A transmitter within the mobile terminal uses the second output signal to generate a carrier signal used to transmit signals back to an associated base station on the uplink channel. As the frequency synthesizer of the present invention allows the mobile terminal to independently change uplink and downlink frequencies, the mobile terminal is capable of responding to changing uplink and downlink communications channel assignments as required in wireless communications systems employing statistical voice multiplexing techniques.

DETAILED DESCRIPTION OF THE INVENTION

Figure 1:
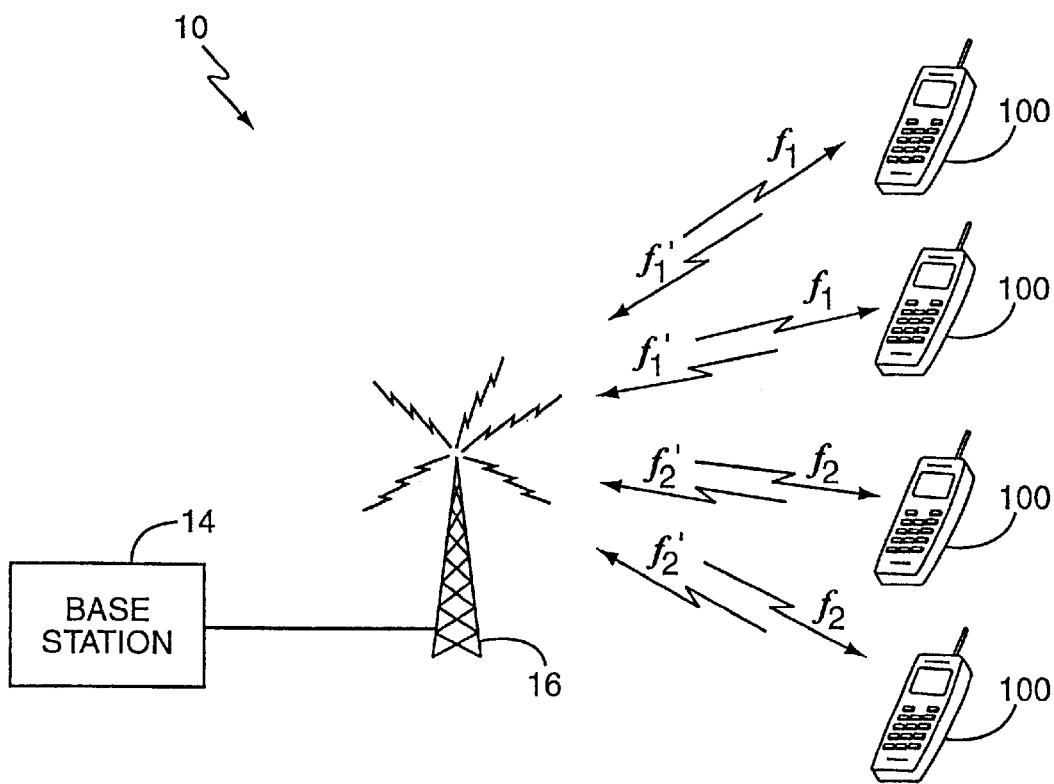
FIG. 1 is a block diagram of an exemplary mobile communications system in which the present invention may be practiced.

FIG. 1 illustrates an exemplary mobile communications system 10 incorporating a base station 14, a base station tower 16, and a plurality of mobile terminals 100. Radio frequency signals representing uplink and downlink communications between the base station 14 and the mobile terminals 100 are received and transmitted by the base station 14 through the base station tower 16. Base station 14 is responsible for assigning a particular communications channel to each of the mobile terminals 100 for both downlink and uplink communications. In FIG. 1, four mobile terminals 100 are shown, two of which are assigned to time slots on downlink frequency $f_1$ for downlink communications, and assigned to timeslots on a corresponding uplink frequency $f_1'$ for uplink communications. Likewise, two additional mobile terminals 100 are shown assigned to timeslots on downlink frequency $f_2$ and corresponding uplink frequency $f_2'$. As earlier noted, existing wireless communications systems, such as TIA/EIA-136 and GSM, define a fixed offset frequency relationship between assigned downlink and uplink frequencies. Thus, while the absolute frequency values differ, the difference (offset) between $f_1$ and $f_1'$ is the same as the difference between $f_2$ and $f_2'$ in such existing systems. The downlink frequency and its corresponding uplink frequency are referred to herein as a frequency pair.

While such existing wireless communications standards maintain a fixed offset frequency for all defined downlink and uplink frequency pairs, next-generation wireless communications systems may do away with fixed offset frequencies. According to the present invention, an uplink frequency $f_n'$ assigned to a particular mobile terminal 100 does not have a predetermined, fixed frequency relationship to the downlink frequency $f_n$ assigned to the same mobile terminal 100, as will be hereinafter described in more detail.

Figure 2:
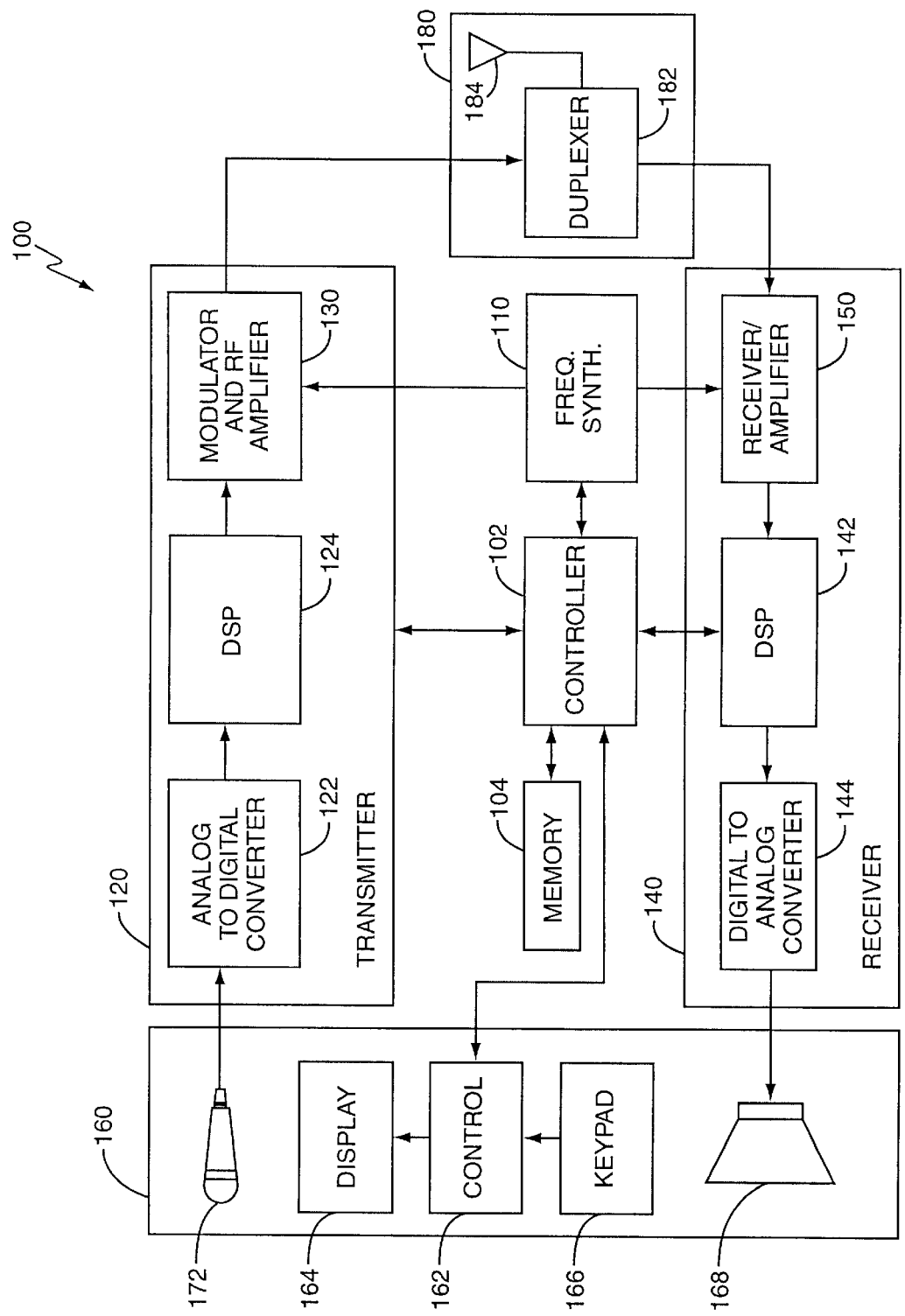
FIG. 2 is a block diagram of an exemplary mobile terminal used in the mobile communications system of FIG. 1.

FIG. 2 illustrates the mobile terminal 100 that may be used in the mobile communications system 10 of FIG. 1. The mobile terminal 100 includes a controller 102 and supporting memory 104, an operator interface 160, a transmitter 120, a receiver 140, a frequency synthesizer 110, and an antenna assembly 180.

The operator interface 160 typically includes a display 164, a keypad 166, a microphone 172, a speaker 168, and an interface controller 162. The display 164 allows an operator to dial digits, monitor call status, and view other service information. The keypad 166 allows the operator to dial numbers, enter commands, and select various options. The interface controller 162 interfaces the display 164 and keypad 166 with the controller 102. The microphone 172 receives acoustic signals (speech) from the user and converts them to analog, electrical signals. A speaker 168 converts analog electrical signals from the receiver 140 to acoustic signals that can be heard by the user.

The analog electrical signals from the microphone 172 are supplied to the transmitter 120. The transmitter 120 includes an analog to digital converter (ADC) 122, a digital signal processor (DSP) 124, and a modulator/RF amplifier 130. The ADC 122 converts analog electrical signals from the microphone 172 into corresponding digital signals, which are transferred to the DSP 124. In cooperation with the controller 102, the DSP 124 processes the digital signals received from the ADC 122 for transmission by modulator/RF amplifier 130. The DSP 124 includes a speech coder and channel coder (not shown) for processing the digitized speech signals to prepare them for transmission. The speech coder compresses the digital signal and the channel coder inserts error detection, error correction, and signaling information in accordance with requirements of the particular mobile communications system 10 in which the mobile terminal 100 is used. The modulator/RF amplifier 130 converts the output from the DSP 124 into a signal suitable for transmission by the antenna assembly 180.

The receiver 140 includes a receiver/amplifier 150, a DSP 142, and a digital-to-analog converter (DAC) 144. Signals received through the antenna assembly 180 are passed to the receiver/amplifier 150, which shifts the frequency spectrum of the received RF signals and amplifies them to a level appropriate for subsequent processing by the DSP 142. The DSP 142 typically includes an equalizer to compensate for phase and amplitude distortions in the channel-corrupted signal, a demodulator for extracting bit sequences from the received signal, and a detector for determining transmitted bits based on the extracted sequences. A channel decoder checks for channel errors in the received signal. The channel decoder includes logic for separating control and signaling data from speech data. Control and signaling data passes to the controller 102 while speech data passes to a speech decoder (not shown) for processing. Processed speech data then passes to the DAC 144 for conversion to an analog speech signal. The analog speech signal drives the speaker 168 to produce an audible output, e.g., voice.

The antenna assembly 180 includes an antenna 184 for transmitting and receiving RF signals. Antenna 184 is coupled to the receiver/amplifier 150 and the modulator/RF amplifier 130 by a duplexer 182. The duplexer 182 permits full duplex communications for receive and transmit operations via the antenna 184. In a TDMA system, such as one operating in accordance with GSM standards, the duplexer 182 may be replaced by a transmit/receive switch (not shown).

The controller 102 coordinates the operation of the transmitter 120 and the receiver 140, and may, for instance, take the form of a typical microprocessor. This microprocessor may be a dedicated or shared microprocessor, a single processor or multiple, parallel processors, as needed or desired. Coordination of the receiver 140 and transmitter 120 includes coordinating power control, channel selection, and timing, as well as a host of other functions known in the art. The controller 102 inserts signaling messages into the transmitted signals and extracts signaling messages from the received signals. The controller 102 responds to any base station commands contained in the extracted signaling messages, including uplink and downlink channel reassignments, and implements user commands. When the user enters commands via the keypad 166, interface controller 162 transfers them to the controller 102 for action. A memory 104 stores and supplies information at the direction of the controller 102 and preferably includes both volatile and nonvolatile storage. Memory 104 may include stored program code and operating data for use by the controller 102.

Frequency synthesizer 110 generates first and second signals used by the receiver 140 and transmitter 120 respectively to tune to the assigned uplink and downlink frequencies. The receiver 140 uses the first output signal to convert the received signal to an intermediate frequency, with this intermediate frequency signal subsequently filtered and processed to extract the transmitted information. The second output signal serves as an input to the transmitter 120 from which it derives a carrier signal used to transmit information back to the base station.

Figure 3:
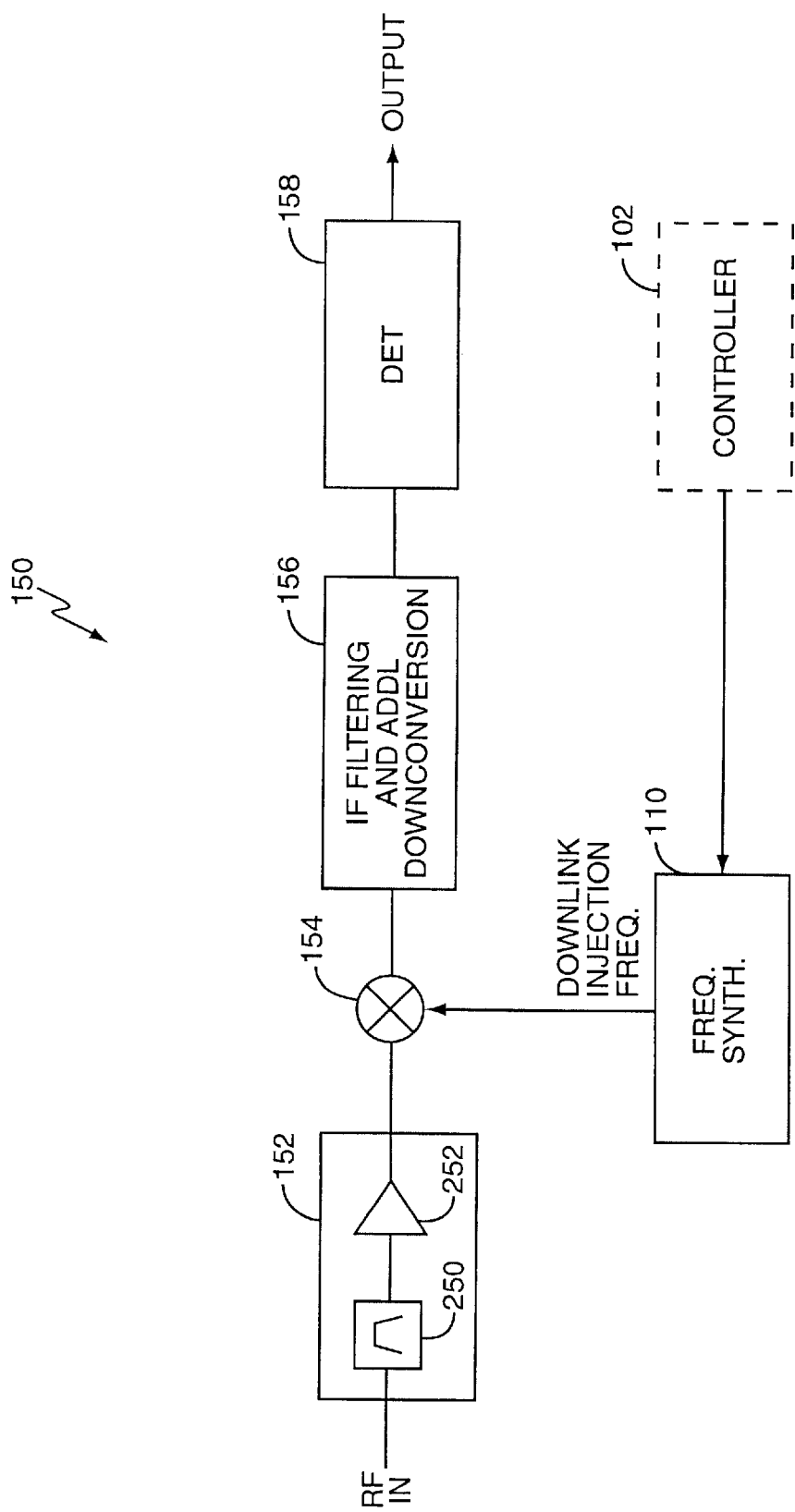
FIG. 3 is a more detailed block diagram of the receiver/amplifier of FIG. 2.

FIG. 3 illustrates the receiver/amplifier 150 of FIG. 2 in more detail. Receiver/amplifier 150 includes a front-end circuit 152, an intermediate frequency stage 156, and a detector 158. RF signals received on the downlink frequency from the base station 14 via the antenna assembly 180 are filtered and amplified in the front-end circuit 152 that includes a bandpass filter 250 and a preamplifier 252. Filtered and amplified signals output from front-end circuit 152 serve as an input to a mixer 154. The mixer 154 outputs a desired intermediate frequency (IF) signal by mixing the signal output from front-end circuit 152 with an injection signal. This injection signal is based on the first output signal from the frequency synthesizer 110. That is, the first output signal may be used directly as the injection signal or may be used to derive the injection signal. The frequency of the first output signal and, therefore, the injection signal, is based on the current channel assignments for the mobile terminal 100. Intermediate frequency stage 156 includes IF filtering and additional downconversion. The output from the intermediate frequency stage 156 is input to detector 158, which processes this output signal to extract the digital information encoded therein.

Figure 4:
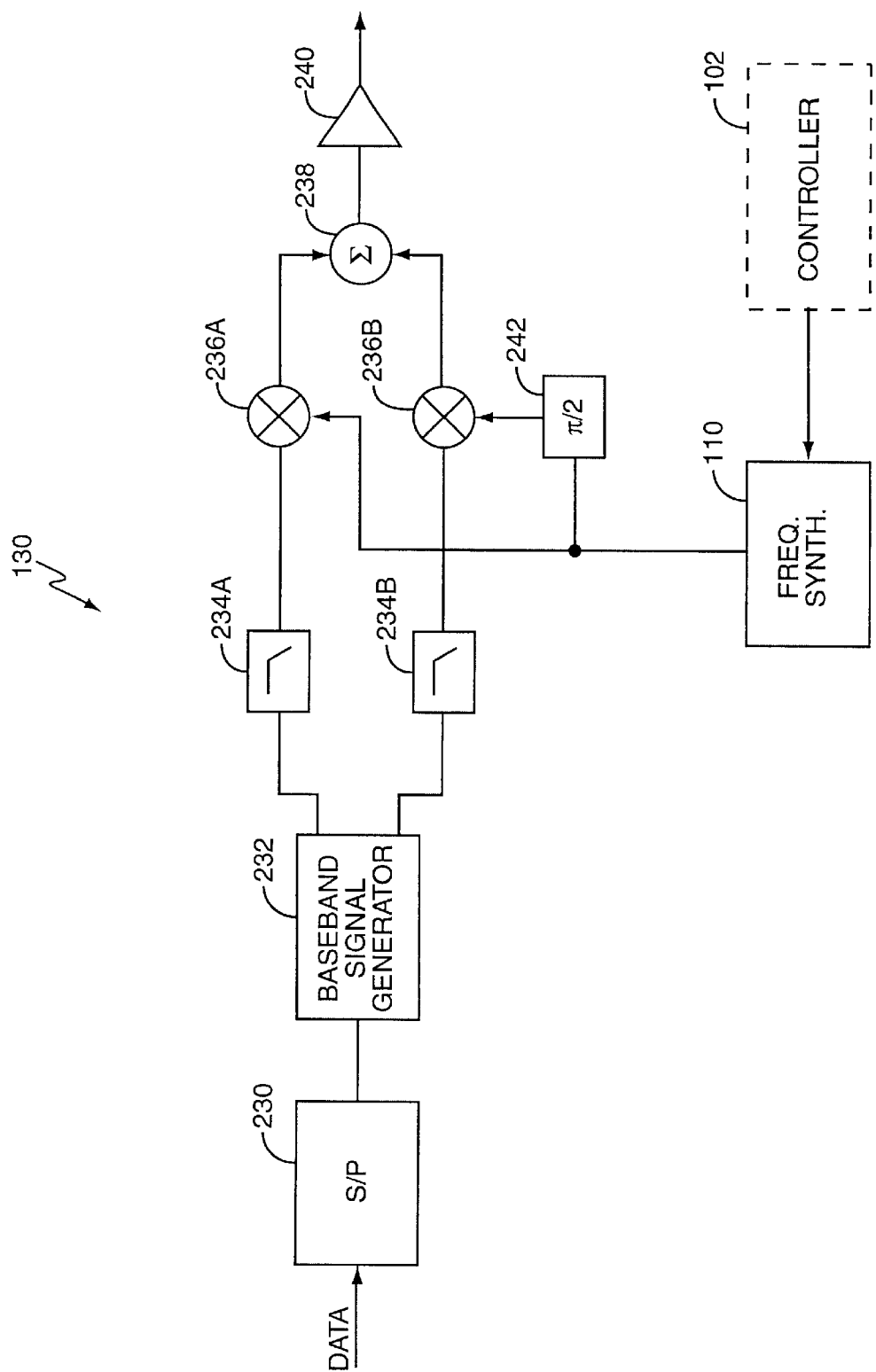
FIG. 4 is a more detailed block diagram of the modulator/RF amplifier of FIG. 2.

FIG. 4 illustrates the modulator/RF amplifier 130 of FIG. 3 in more detail. Note that FIG. 4 illustrates a QPSK modulator/RF amplifier 130 that is used in an exemplary embodiment for the mobile terminal 100 in the present invention. However, many other types of modulation may be used to similar advantage in other embodiments of the present invention. Modulator/RF amplifier 130 includes a serial-to-parallel converter (S/P) 230, a baseband signal generator 232, low-pass filters 234A/234B, modulators 236A/236B, a summer 238, and an RF amplifier 240. Digital data from the DSP 124 is input to S/P 230. The baseband signal generator 232 converts the parallel data output from S/P 230 into baseband sinusoidal signal outputs, one output signal formed as a cosine representation of the input data and one output signal formed as a sine representation of the input data. These two baseband signals are used to modulate an RF carrier signal derived from the second output signal from the frequency synthesizer 110 to the modulator/RF amplifier 130. The outputs from modulators 236A and 236B are combined in summer 238 for input to RF amplifier 240. Note that modulator 236B is driven by a carrier signal 90° out of phase with respect to modulator 236A using a $\pi/2$ phase shifter 242 to effect the desired quadrature carrier signal transmission. The amplified RF signal output by RF amplifier 240 is then transmitted to the base station 14 using the antenna assembly 180.

As noted, in existing TDMA systems, such as TIA/EIA-136 and GSM, a fixed frequency relationship exists between uplink and downlink channels. In the past, mobile terminal designers have taken advantage of this fixed frequency relationship to simplify the design of prior-art frequency synthesizers that may be used in prior-art mobile terminals.

Figure 5:
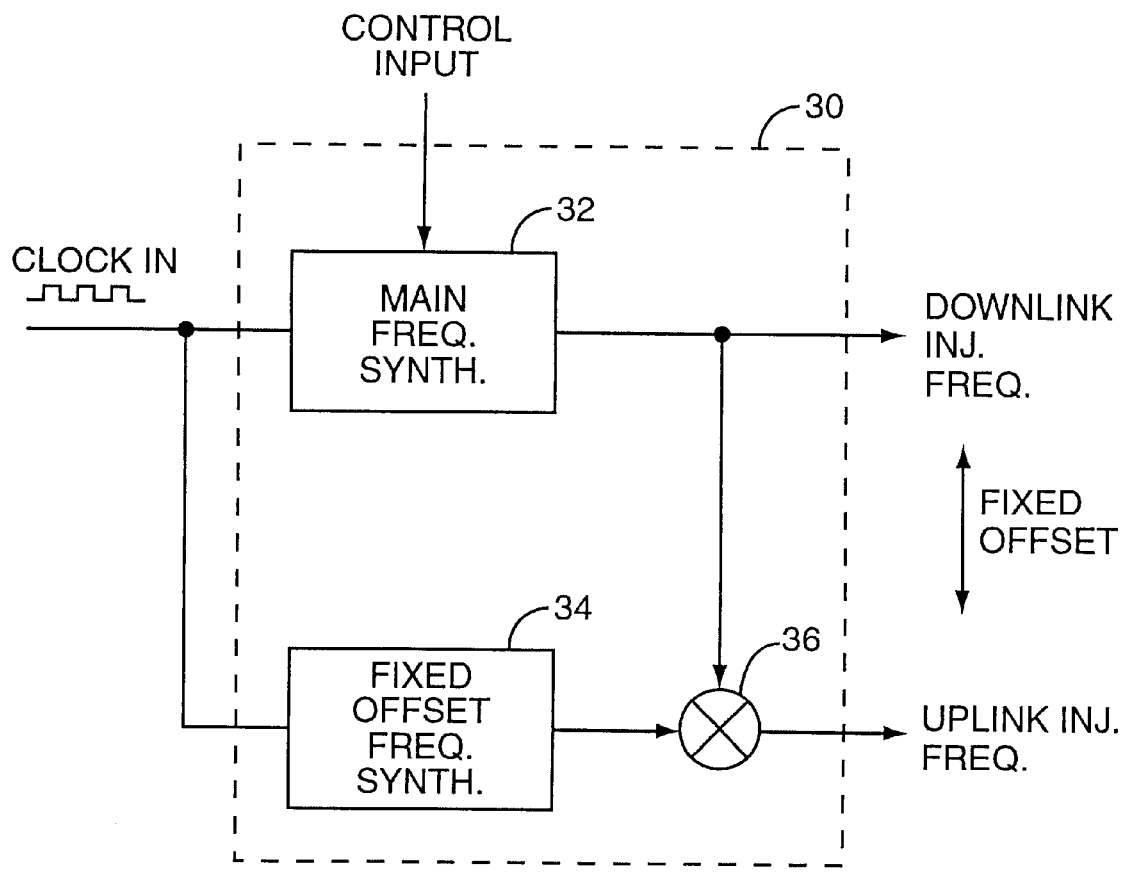
FIG. 5 is a block diagram of a typical prior-art frequency synthesizer.

FIG. 5 is a block diagram of a typical prior-art frequency synthesizer, indicated generally by the numeral 30, which may be used in a prior-art mobile terminal. Frequency synthesizer 30 includes a main frequency synthesizer 32, a fixed offset frequency synthesizer 34, and a mixer 36. The prior-art frequency synthesizer 30 generates first and second output signals used respectively by a receiver and a transmitter in the prior-art mobile terminal. The prior-art frequency synthesizer 30 generates the first and second output signals from a clock signal having a known frequency value provided, for example, by a local oscillator (not shown). The clock signal is input to both the main frequency synthesizer 32 and the fixed offset frequency synthesizer 34. The main frequency synthesizer 32 multiplies or divides the clock signal from the local oscillator to generate the first output signal. The constant used by the main frequency synthesizer 32 to multiply or divide the clock signal is selected to yield the desired first output frequency. The constant is determined by a control signal input to the main frequency synthesizer 32 by a controller included in the prior-art mobile terminal. The fixed offset frequency synthesizer 34 generates an offset signal at a predetermined offset frequency (e.g., 80 MHz in GSM). The fixed offset frequency synthesizer 34 multiplies or divides the clock signal by a fixed constant that cannot be changed during operation of the prior-art mobile terminal. Mixer 36 combines the offset signal generated by the fixed offset frequency synthesizer 34 and the first output signal generated by the main frequency synthesizer 32 to generate a second output signal having a fixed frequency relationship to the first output signal. Thus, the frequency of the second output signal will change by a fixed corresponding amount whenever the frequency of the first output signal is changed.

The prior-art frequency synthesizer 30 of FIG. 5 is not suitable for use in mobile terminals 100 that employ statistical voice multiplexing because of the fixed frequency relationship between the first and second output signals. In mobile terminals 100 employing statistical voice multiplexing, uplink and downlink channels are part of a common pool and are assigned to mobile terminals 100 independently. One solution to this problem would be to use two separate frequency synthesizers, but this would increase the cost and complexity of the mobile terminal 100. Additionally, using two frequency synthesizers would increase power consumption and reduce the battery life.

Figure 6:
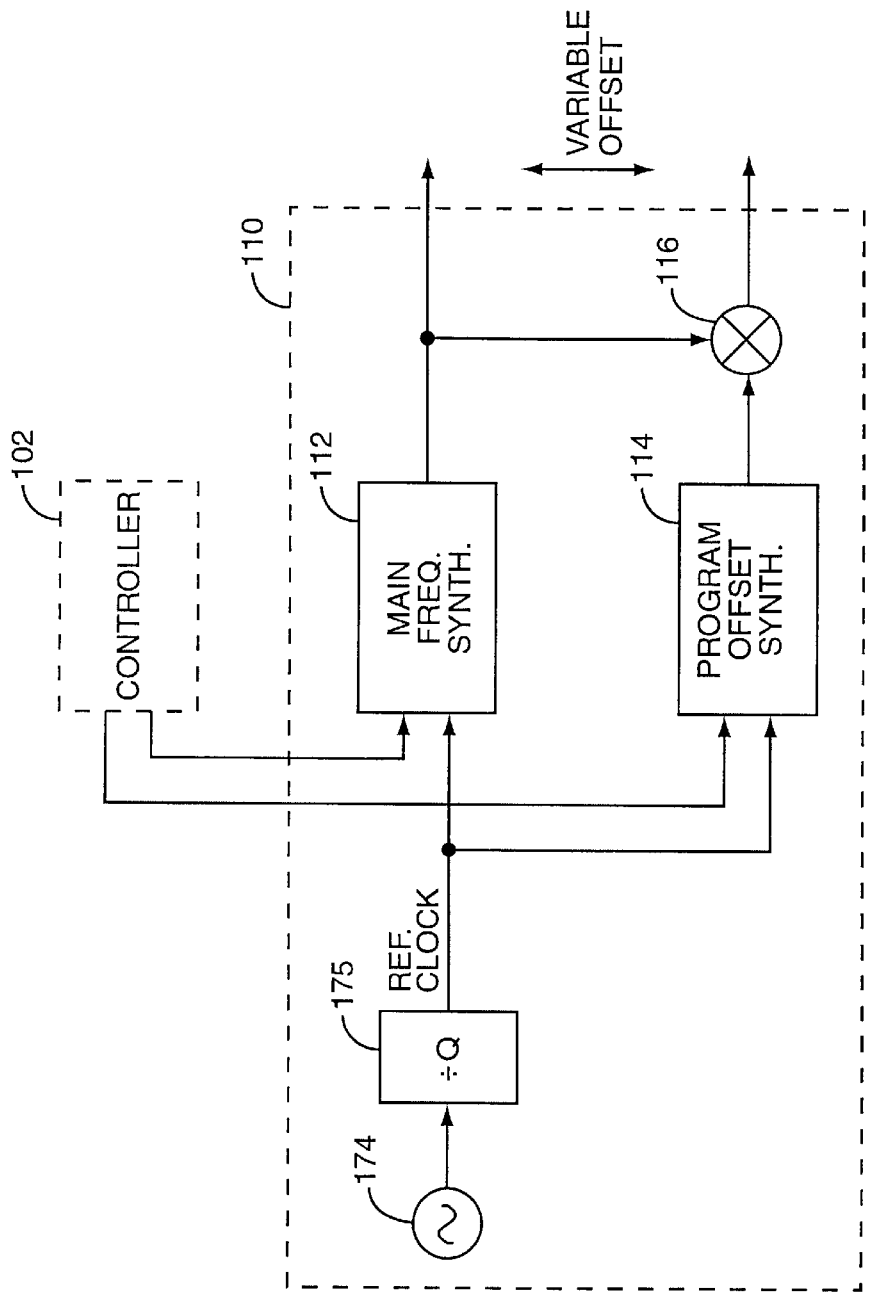
FIG. 6 is a block diagram of an exemplary embodiment of the frequency synthesizer of the present invention.

FIG. 6 is a block diagram of a frequency synthesizer 110 made in accordance with an exemplary embodiment of the present invention. Frequency synthesizer 110 includes a main frequency synthesizer 112, a programmable offset frequency synthesizer 114, and a mixer 116. A reference clock input is input to the main frequency synthesizer 112 and the programmable offset frequency synthesizer 114. A temperature-controlled crystal oscillator (TXCO) 174 serves as an exemplary reference clock source for input to the frequency synthesizer 110. The output from the TXCO 174 is preferably passed through a digital divider 175 to both set its frequency to a desired value as well as to ensure that the reference clock pulses have uniform characteristics. Main frequency synthesizer 112 generates a first output that, as explained above, is used as an injection signal by receiver 140. The frequency of the first output signal is determined by a first control signal input to the main frequency synthesizer 112 from the controller 102. Offset synthesizer 114 generates an offset signal that, preferably, is derived from the same reference clock input used by the main frequency synthesizer 112. The frequency of the offset signal is determined by a second control signal input to the offset frequency synthesizer by controller 102. The offset signal is then combined in a mixer 116 to generate a second output signal. Controller 102 determines the frequency of the first and second output signals based on current downlink and uplink communication channel assignments received at the mobile terminal 100 from the base station 14.

Because the carrier signal used in the transmitter 120 needs to change independently of the downlink frequency, the controller 102 can vary the frequency of the offset signal within a defined range of offset frequencies depending on changing channel assignments. Thus, the specific offset frequency generated by the programmable offset frequency synthesizer 114 depends on the reference clock input and the value of the second control signal output from controller 102.

The controller 102 may adjust the value of the second control signal, thereby changing the frequency of the second output signal without changing the value of the first output signal being output by the main frequency synthesizer 112. Thus, by incorporating the frequency synthesizer 110 of the present invention, the mobile terminal 100 may adjust its uplink channel frequency while it maintains a current downlink channel frequency. This capability is consistent with the requirements of statistical voice multiplexing, wherein the base station 14 independently changes uplink and downlink channel assignments used by the mobile terminal 100, based on the changing communication channel resources available. Additionally, the controller 102 may alter the first control signal it provides to the main frequency synthesizer 110 in response to changing downlink channel assignments to change the downlink frequency. Of course, changing the frequency of the first output signal used by the receiver 140 necessarily changes the absolute value of the second output signal used by the transmitter 120 based on the mixing operation performed by mixer 116. However, the controller 102 can simultaneously change the frequency offset between the first and second output signals when changing the downlink frequency such that the frequency of the second output signal remains the same. In short, the controller 102 may independently change uplink and downlink frequencies by changing the first and second control signals output to the main frequency synthesizer 112 and the programmable offset frequency synthesizer 114, respectively.

Because the range of required offset frequencies output by the programmable offset frequency synthesizer 114 is typically narrower than the range of required downlink frequencies, the programmable offset frequency synthesizer 114 may be made more economically than the main frequency synthesizer 112. Moreover, the time permissible between adjusting the control signal input to the programmable offset frequency synthesizer 114 and obtaining a stable uplink frequency output is longer than the permissible settling time for downlink frequency changes. This is illustrated in more detail in subsequent diagrams herein. Thus, the frequency synthesizer 110 of the present invention imparts economic advantages in comparison to alternative approaches.

In an exemplary embodiment of the frequency synthesizer 110 of the present invention, the main frequency synthesizer 112 and offset frequency synthesizer 114 are implemented as Phase-Locked-Loops (PLLs), which are well known in the art. To briefly summarize, a PLL produces an output frequency based on comparing signals that are ratios of the reference frequency and the output frequency. Using programmable dividers, the ratios used to divide down the reference frequency and/or the output frequency may be varied, thus changing the output frequency of the main frequency synthesizer 112 and/or programmable offset frequency synthesizer 114. Overall, the effect of the PLL configuration is to produce an output signal having a frequency that is a desired multiple of the reference signal frequency. Thus, the controller 102 controls the frequency of the output signals from the main frequency synthesizer 112 and programmable offset frequency synthesizer 114 based on the values of the divisors/multipliers it outputs to the main frequency synthesizer 112 and the programmable frequency synthesizer 114. Of course, frequency synthesis may be based on a non-integer (fractional) relationship between the reference clock and the output frequency. For example, the main frequency synthesizer 112 may produce its output frequency based on multiplying the reference clock signal by an integer D or by a fractional value D/M, where M is also an integer.

Of course, other frequency synthesis techniques exist and the present invention is not limited to specific implementations regarding the main frequency synthesizer 112 and the programmable offset frequency synthesizer 114. The specific nature of the first and second control signals output from the controller 102 for controlling the frequency value of the output signals from main frequency synthesizer 112 and programmable offset frequency synthesizer 114 will depend upon the specific implementation of these synthesizers. For example, the frequency synthesizer 110 may operate on the basis of direct digital synthesis (DDS) wherein required frequencies are produced using a digital accumulator to access sinusoidal sample values stored as a look-up table in memory, these sample values being used to drive a digital-to-analog converter. DDS has the advantage of fine frequency steps and fast settling time but, at high output frequencies, imposes significant requirements on the digital circuits used.

Figure 7:
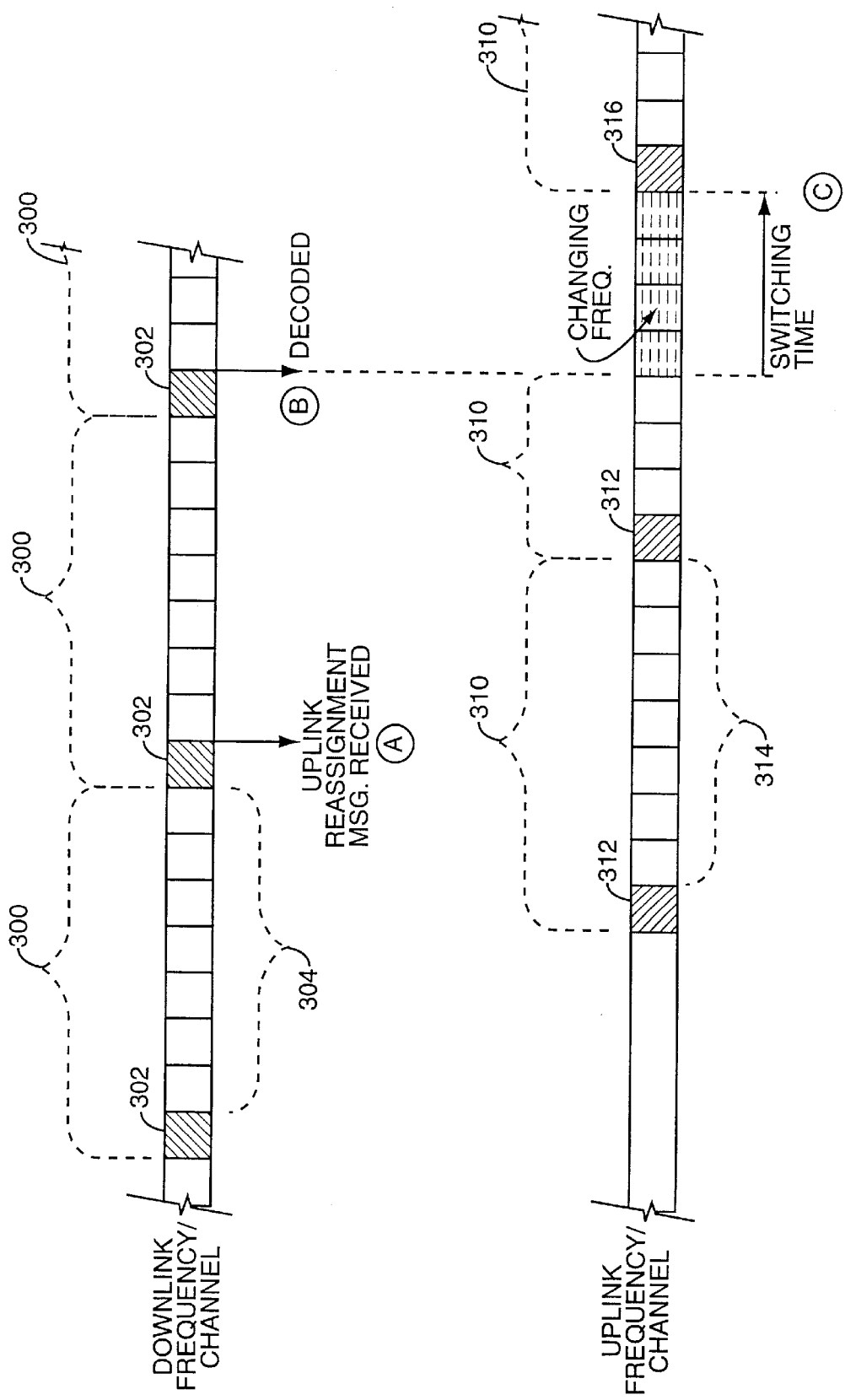
FIG. 7 illustrates the response of an exemplary mobile terminal to an uplink channel reassignment in the context of a TDMA-based system in accordance with the present invention.

As noted, the present invention includes consideration of the required settling times associated with changing the uplink frequency and the downlink injection frequency generated by the frequency synthesizer 110 of the present invention. FIG. 7 illustrates the process of the mobile terminal 100 using the frequency synthesizer 110 of the present invention to adjust its uplink frequency based on a new channel assignment received from its controlling base station 14.

In FIG. 7, repeating downlink channel frames 300 include a timeslot 302 assigned to a given mobile terminal 100, and remaining timeslots 304 possibly in use by other mobile terminals 100 operating on the same downlink frequency. The given mobile terminal 100 receives information from the controlling base station 14 during each of its assigned timeslots 302. At Point A, the mobile terminal 100 receives an uplink frequency reassignment from the base station 14. At Point B, the mobile terminal 100 has completely received and decoded the reassignment message and reconfigures the programmable offset frequency synthesizer 114 to change the frequency of the offset signal, which results in a corresponding change in the frequency of the second output signal.

Repeating uplink channel frames 310 include a timeslot 312 assigned to the given mobile terminal 100, and remaining timeslots 314 possibly in use by other mobile terminals 100 operating on the same uplink frequency. Note that in the exemplary embodiment of FIG. 7, the uplink channel frames 310 are offset in time from the downlink channel frames 300 by a fixed number of timeslots. At Point B in the corresponding series of downlink frames 300—the point at which the uplink frequency reassignment message is decoded-the controller 102 changes the second control signal input to programmable frequency synthesizer 114, allowing the mobile terminal 100 to begin operating on the newly assigned uplink frequency. Thus, the timeslots in the series of uplink frames 310 between Point B and Point C represent a period of time during which the mobile terminal 100 changes its uplink frequency to the new assignment. By Point C, the output from the programmable frequency synthesizer 114 stabilizes and the mobile terminal 100 transmits to the base station 14 using the newly assigned uplink frequency with a potentially new timeslot 316.

Figure 8:
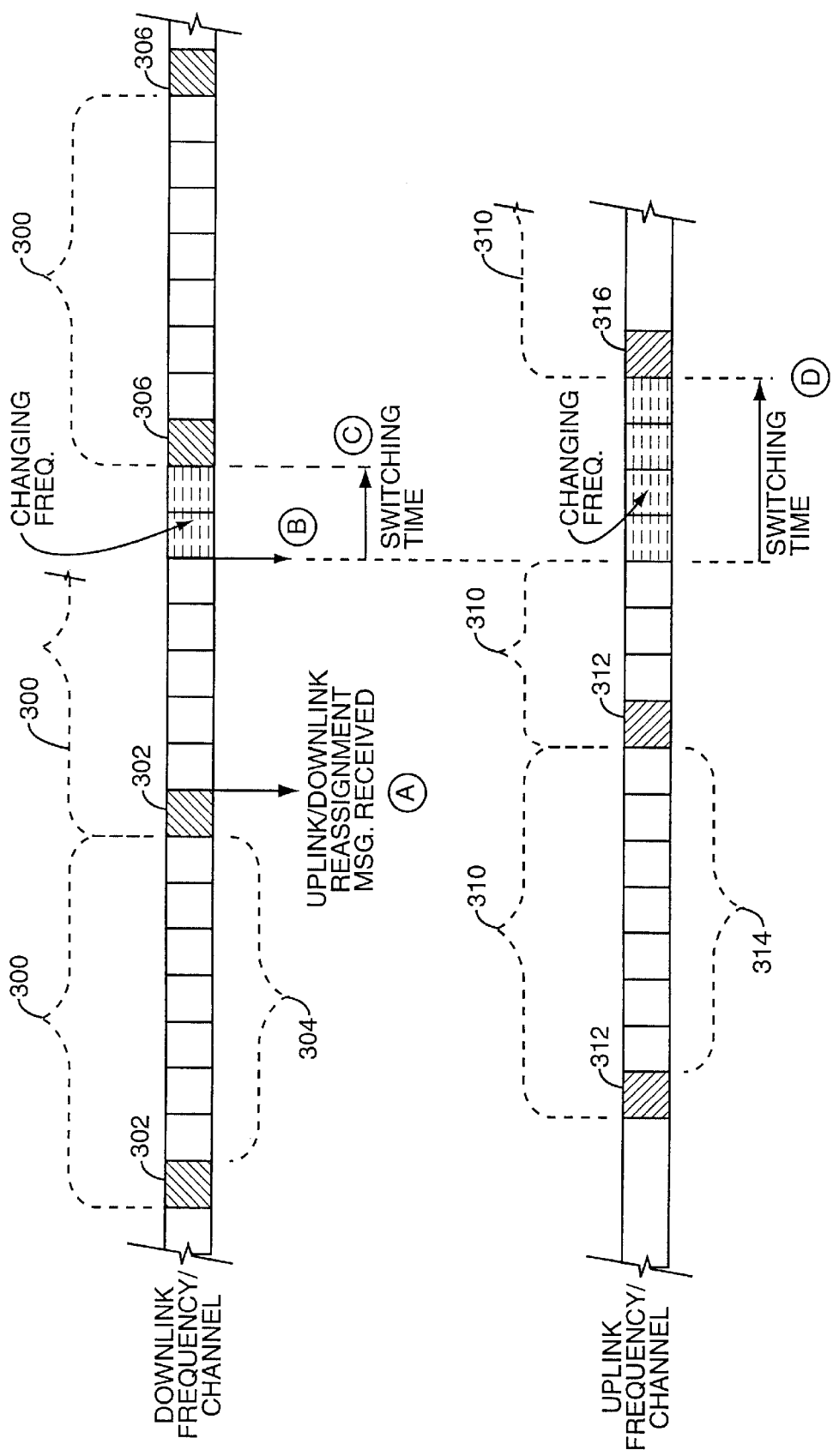
FIG. 8 illustrates the response of an exemplary mobile terminal to a downlink and uplink channel reassignment in the context of a TDMA-based system in accordance with the present invention.

FIG. 8 illustrates the process of changing the downlink channel to a different frequency. The process is similar to that illustrated in FIG. 7 but includes the added complexity of adjusting the programmable offset frequency synthesizer 114 in response to the changing downlink channel assignment. Mobile terminal 100 receives a downlink frequency reassignment message at point B and changes its main frequency synthesizer 112 to a new downlink frequency by altering the first control signal. Point C represents the point in time within the repeating downlink frames 300 that the downlink frequency output from the main frequency synthesizer 112 must be settled to the newly assigned value. Thus, the time slots between Point B and Point C represent the period of time during which the downlink frequency of the mobile terminal 100 is changing from the current value to the newly assigned value, with time slot 306 representing the assigned timeslot on the newly assigned downlink frequency.

Point D represents the point in time in the series of uplink frames at which the programmable offset frequency synthesizer 114 must settle in response to the changing downlink frequency assignment. Note that with a changing downlink frequency assignment, the mobile terminal 100 may maintain the same uplink frequency offset relationship with the downlink frequency, in which case the absolute value of the uplink frequency changes as a function of the changed downlink frequency, but the offset between uplink and downlink frequencies remains the same. Of course, the mobile terminal 100 may adjust both the downlink frequency and the offset relationship at the same time to maintain the current uplink frequency. The timeslots between Points B and D within the uplink frames 310 represent a period of changing uplink frequency, with slot 316 representing the newly designated frame time slot for the mobile terminal 100 operating on the new uplink frequency.

In the disclosed embodiment of the mobile terminal 100, the first output signal from the frequency synthesizer 110 is used as an injection signal, or to derive an injection signal. The second output from frequency synthesizer 110 is used as a carrier signal, or used to derive a carrier signal. Equivalently, the first output signal could be used as a carrier signal, or to derive a carrier signal, and the second output signal could be used as an injection signal, or to derive an injection signal.

The present invention may, of course, be carried out in other specific ways than those herein set forth without departing from the spirit and essential characteristics of the invention. Other embodiments of the present invention extend beyond a preferred use within mobile terminals 100. Indeed, any system or equipment required to synthesize two or more frequencies with variable offsets from one another may advantageously use the present invention's combination of main frequency synthesizer 112 and programmable offset frequency synthesizer 114. Further, note that the particular implementation or design of the frequency synthesizers used to practice the present invention is not critical, save for including the inventive concept of programmable offset frequency control. The present embodiments are, therefore, to be considered in all respects as illustrative and not restrictive, and all changes coming within the meaning and equivalency range of the appended claims are intended to be embraced therein.

What is claimed is:

1. An apparatus for synthesizing a first frequency and a second frequency used to form an ad-hoc uplink and downlink channel pair, said apparatus comprising:

a main frequency synthesizer generating said first frequency based on a reference clock input signal and a first control signal, said first frequency used as one of a carrier signal for signals transmitted on said uplink channel and an injection signal for signals received on said downlink channel;

an offset frequency synthesizer generating a variable offset frequency based on said reference clock input signal and a second control signal;

a mixer combining said first frequency with said variable offset frequency to produce said second frequency, said second frequency used as the other one of said carrier signal and said injection signal; and a controller to independently generate said first and second control signals to form said ad-hoc uplink and downlink channel pair.

2. The apparatus of claim 1 wherein said main frequency synthesizer comprises a phase locked loop.

3. The apparatus of claim 2 wherein said offset frequency synthesizer comprises a phase locked loop.

4. A mobile terminal comprising:

a receiver receiving signals transmitted from a remote source on a receive channel and converting said received signals to a different frequency by mixing said received signals with an injection signal;

a transmitter modulating a carrier signal and transmitting said modulated carrier signal on a transmit channel selected independently from said receive channel, said receive channel and said transmit channel forming a channel pair having a variable frequency offset; and a frequency synthesizer comprising:

a main frequency synthesizer generating said first frequency based on a reference clock input signal and a first control signal, said first frequency used as one of a carrier signal for signals transmitted on said uplink channel and an injection signal for signals received on said downlink channel;

an offset frequency synthesizer generating a variable offset frequency based on said reference clock input signal and a second control signal:

a mixer combining said first frequency with said variable offset frequency to produce said second frequency, said second frequency used as the other one of said carrier signal and said injection signal, and a controller to independently generate said first and second control signals to form an ad-hoc uplink and downlink channel pair.

5. The mobile terminal of claim 4 wherein said controller computes a value for said second control signal based on a frequency difference between said uplink channel assignment and said downlink channel assignment.

6. The mobile terminal of claim 4 wherein said controller independently controls said first and second control signals, thereby providing independent control of said first and second frequencies.

7. A method for generating first and second output signals at different frequencies, said first and second output signals used to form an ad-hoc uplink and downlink channel pair, said method comprising:

generating a first output signal at a first selected frequency based on a first control signal, said first output signal being used as one of a carrier signal for signals transmitted on said uplink channel and an injection signal for signals received on said downlink channel;

generating an offset signal at a selectable offset frequency based on a second control signal;

mixing said offset signal with said first output signal to generate a second output signal at a second selected frequency, wherein said first and second output signals have a variable frequency offset based on said second control signal, and said second output signal being used as the other one of said carrier signal and said injection signal; and independently generating said first and second control signals to form said ad-hoc uplink and downlink channel pair.

8. The method of claim 7 further comprising changing said first selected frequency of said first output signal responsive to a change in said first control signal.

9. The method of claim 8 further comprising changing said offset frequency responsive to a change in said second control signal.

10. The method of claim 9 wherein changing said offset frequency responsive to a change in said second control signal comprises changing said offset frequency by an amount corresponding to said change in said first selected frequency of said first output signal so that said second selected frequency of said second output signal remains the same both before and after said change in said first output signal.

11. The method of claim 7 further comprising changing said offset frequency responsive to a change in said second control signal.

12. A method for generating first and second signals at different frequencies, said first and second signals used to form an ad-hoc uplink and downlink channel pair, said method comprising:

selecting a first frequency for a first output signal;

generating said first output signal at said first frequency based on a first control signal, said first output signal being used as one of a carrier signal for signals transmitted on said uplink channel and an injection signal for signals received on said downlink channel;

selecting a second frequency for a second output signal, wherein said second output signal has a variable offset frequency relationship to said first output signal;

determining an offset frequency based on said first and second frequencies;

generating an offset signal at said offset frequency based on a second control signal that determines said offset frequency;

mixing said offset signal with said first output signal to generate said second output signal at said second frequency, said second output signal being used as the other one of said carrier signal and said injection signal; and independently generating said first and second control signals to form said ad-hoc uplink and downlink channel pair.

13. The method of claim 12 further comprising:

determining a value for said second control signal corresponding to said offset frequency; and inputting said second control signal into a programmable offset frequency synthesizer adapted to produce said offset signal having a variable offset frequency determined by said second control signal.

14. The method of claim 13 further including changing said first frequency of said first output signal responsive to a change in said first control signal.

15. The method of claim 13 further comprising changing said offset frequency responsive to a change in said second control signal.

16. The method of claim 14 further including changing said offset frequency responsive to a change in said second control signal.

17. The method of claim 16 wherein changing said offset frequency responsive to a change in said second control signal comprises changing said offset frequency by an amount corresponding to said change in said first frequency of said first output signal so that said second frequency of said second output signal remains the same both before and after said change in said first output signal.

18. A method for communicating between a base station and a mobile terminal in a mobile communications system, said method comprising:

assigning an uplink channel and a downlink channel to said mobile terminal, said uplink channel selected independently from said downlink channel and forming an ad-hoc uplink/downlink channel pair having a variable frequency difference;

transmitting an uplink channel assignment and a downlink channel assignment from said base station to said mobile terminal based on said assigned uplink and downlink channels in said ad-hoc uplink/downlink channel pair;

receiving signals at said mobile terminal on said assigned downlink channel comprising:

generating a first output signal at a first selected frequency based on a first control signal, said first control signal based on said assigned downlink channel; and mixing said received signals with an injection signal to produce an intermediate frequency signal, said injection signal being based on said first output signal; and transmitting signals from said mobile terminal on said assigned uplink channel to said base station comprising:

generating an offset signal at a selectable offset frequency based on a second control signal, said second control signal based on the variable frequency difference between said assigned uplink channel and said assigned downlink channel, such that said assigned uplink channel is selected independently from said assigned downlink channel;

mixing said offset signal with said first output signal to generate a second output signal at a second selected frequency; and modulating a carrier signal at a carrier frequency to produce said transmitted signals, said carrier frequency varying based on said second output signal; and independently generating first and second control signals based on said uplink and downlink channels in said ad-hoc uplink/downlink channel pair.

19. The method of claim 18 further comprising:

transmitting a changed downlink channel assignment from said base station to said mobile terminal; and changing said first selected frequency of said first output signal in response to said changed downlink channel assignment.

20. The method of claim 19 further comprising generating a changed offset signal having a changed offset frequency such that said second selected frequency of said second output signal remains constant both before and after said change in said first selected frequency.

21. The method of claim 18 further comprising:

transmitting a changed uplink channel assignment from said base station to said mobile terminal; and generating a changed offset frequency in response to receiving said changed uplink channel assignment.

22. A method for communicating between a base station and a mobile terminal in a mobile communications system, said method comprising:

assigning an uplink channel and a downlink channel to said mobile terminal, said uplink channel being selected independently from said downlink channel and forming an ad-hoc channel pair having a variable frequency difference;

transmitting an uplink channel assignment and a downlink channel assignment from said base station to said mobile terminal based on said assigned uplink and downlink channels in said ad-hoc channel pair;

independently generating first and second output signals at first and second frequencies, respectively, based on said assigned uplink and: downlink channels in said ad-hoc channel pair, comprising:

generating said first output signal based on a first control signal that determines said first frequency;

generating an offset signal at a selectable offset frequency based on a second control signal that determines said selectable offset frequency, such that said assigned uplink channel is selected independently from said assigned downlink channel, wherein said selectable offset frequency is related to the variable frequency difference between said assigned uplink and downlink channels; and mixing said offset signal with said first output signal to generate said second output signal at said second frequency;

receiving a received signal at said mobile terminal on said assigned downlink channel comprising:

mixing said received signals with an injection signal to produce an intermediate frequency signal, said injection signal being based on one of said first and second output signals; and transmitting a transmitted signal from said mobile terminal on said assigned uplink channel to said base station comprising:

modulating a carrier signal at a carrier frequency to produce said transmitted signal, said carrier signal based on the other of said first and second output signals.

* * * * *